(12) United States Patent
Ahn et al.

(10) Patent No.: US 8,871,616 B2
(45) Date of Patent: Oct. 28, 2014

(54) METHODS OF FABRICATING THIN FILM TRANSISTOR AND ORGANIC LIGHT EMITTING DIODE DISPLAY DEVICE HAVING THE SAME

(75) Inventors: Ji-Su Ahn, Seoul (KR); Won-Pil Lee, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 975 days.

(21) Appl. No.: 12/718,169

(22) Filed: Mar. 5, 2010
(Under 37 CFR 1.47)

(65) Prior Publication Data
US 2011/0037073 A1 Feb. 17, 2011

(30) Foreign Application Priority Data

Aug. 13, 2009 (KR) .................. 10-2009-0074817

(51) Int. Cl.
| | |
|---|---|
| H01L 21/20 | (2006.01) |
| H01L 29/66 | (2006.01) |
| H01L 29/45 | (2006.01) |
| H01L 21/02 | (2006.01) |
| H01L 29/417 | (2006.01) |
| H01L 29/423 | (2006.01) |
| H01L 27/12 | (2006.01) |
| H01L 27/32 | (2006.01) |

(52) U.S. Cl.
CPC ...... *H01L 27/1214* (2013.01); *H01L 29/66757* (2013.01); *H01L 29/458* (2013.01); *H01L 21/02532* (2013.01); *H01L 21/02488* (2013.01); *H01L 29/41733* (2013.01); *H01L 29/42384* (2013.01); *H01L 21/02667* (2013.01); *H01L 27/3262* (2013.01); *H01L 21/02422* (2013.01)
USPC ................ 438/486; 438/166; 257/E29.273

(58) Field of Classification Search
USPC .................. 438/166, 482, 486, 487, 466; 257/E29.273, E27.116
See application file for complete search history.

(56) References Cited

U.S. PATENT DOCUMENTS

| | | | |
|---|---|---|---|
| 6,326,226 B1 | 12/2001 | Jang et al. | |
| 6,480,255 B2 * | 11/2002 | Hoshino et al. | ............... 349/149 |
| 6,482,721 B1 | 11/2002 | Lee | |
| 6,500,736 B2 | 12/2002 | Kim et al. | |
| 6,524,662 B2 | 2/2003 | Jang et al. | |
| 6,531,348 B2 | 3/2003 | Kim et al. | |
| 7,449,397 B2 | 11/2008 | Ro et al. | |

(Continued)

FOREIGN PATENT DOCUMENTS

| | | |
|---|---|---|
| JP | 04369271 | 12/1992 |
| JP | 2002-016014 A | 1/2002 |

(Continued)

*Primary Examiner* — Laura Menz
*Assistant Examiner* — Candice Y Chan
(74) *Attorney, Agent, or Firm* — Robert E. Bushnell, Esq.

(57) ABSTRACT

A thin film transistor (TFT), an OLED device having the TFT and a method of fabricating the same and a method of fabricating an organic light emitting diode (OLED) display device that includes the TFT. The method of fabricating a TFT includes providing a substrate, forming a buffer layer on the substrate, forming an amorphous silicon layer pattern on the buffer layer, forming a metal layer on an entire surface of the substrate, forming a semiconductor layer by applying an electrical field to the metal layer to crystallize the amorphous silicon layer pattern, forming source and drain electrodes connected to the semiconductor layer by patterning the metal layer, forming a gate insulating layer on the entire surface of the substrate, forming a gate electrode on the gate insulating layer to correspond to the semiconductor layer and forming a protective layer on the entire surface of the substrate.

20 Claims, 4 Drawing Sheets

(56) References Cited

U.S. PATENT DOCUMENTS

| | | | |
|---|---|---|---|
| 7,999,261 B2 * | 8/2011 | Ahn et al. | 257/66 |
| 8,404,529 B2 * | 3/2013 | Ahn et al. | 438/166 |
| 8,405,088 B2 * | 3/2013 | Ahn et al. | 257/66 |
| 8,420,513 B2 * | 4/2013 | Ahn et al. | 438/486 |
| 2009/0042342 A1 | 2/2009 | Ro et al. | |
| 2009/0189160 A1 * | 7/2009 | Ahn et al. | 257/66 |
| 2010/0001265 A1 * | 1/2010 | Ahn et al. | 257/40 |
| 2010/0227443 A1 * | 9/2010 | Lee et al. | 438/166 |

FOREIGN PATENT DOCUMENTS

| | | |
|---|---|---|
| JP | 2002-280304 A | 9/2002 |
| JP | 2002-289520 A | 10/2002 |
| JP | 2003203924 | 7/2003 |
| JP | 2006-100807 A | 4/2006 |
| JP | 2008270773 | 11/2008 |
| JP | 2009-076894 A | 4/2009 |
| JP | 2009-528696 A | 8/2009 |
| KR | 1020000031709 A | 6/2000 |
| KR | 2004-0102350 | 12/2004 |
| KR | 1020060073771 A | 6/2006 |
| KR | 102 090073892 A | 7/2009 |
| WO | 2006/098513 | 9/2006 |
| WO | 2007/100233 | 9/2007 |
| WO | 2007100233 | 9/2007 |
| WO | 2009/066949 | 5/2009 |

\* cited by examiner

US 8,871,616 B2

METHODS OF FABRICATING THIN FILM TRANSISTOR AND ORGANIC LIGHT EMITTING DIODE DISPLAY DEVICE HAVING THE SAME

CLAIM OF PRIORITY

This application makes reference to, incorporates the same herein, and claims all benefits accruing under 35 U.S.C. §119 from an application earlier filed in the Korean Intellectual Property Office on 13 Aug. 2009 and there duly assigned Serial No. 10-2009-74817.

BACKGROUND OF THE INVENTION

1. Field of the Invention

An aspect of the present invention relates to methods of fabricating a thin film transistor and an organic light emitting diode display device having the same that can minimize defects of the device and increase production yield by preventing arcing during crystallization of a semiconductor layer due to Joule heat generated upon the application of an electrical field to a metal layer electrically connected to the semiconductor layer.

2. Description of the Related Art

Generally, annealing techniques include a furnace annealing technique using a heat furnace, a rapid thermal annealing (RTA) technique using radiant heat such as a halogen lamp, a laser annealing technique using laser, and an annealing technique using Joule heat. The annealing techniques are determined according to characteristics of the material and process, such as a range of an annealing temperature, uniformity of the annealing temperature, a heating rate, a cooling rate, purchase price, and maintenance cost. Particularly, when high temperature annealing is needed, or high rate annealing is needed only in a local region of a material due to characteristics of the material and process, the selection of annealing techniques is very limited.

The laser annealing technique can rapidly anneal a surface of the material, but laser annealing applies to only a limited set of materials because the possibility of the annealing is determined according to the kind of material to be annealed. Particularly, since scanned linear laser beams overlap when annealing a large-sized device, non-uniformity in intensity of the laser beam and non-uniformity in irradiation level of the laser beam by time can occur. Also, laser annealing requires very expensive equipment having a high maintenance cost.

The RTA technique is widely applied to semiconductor fabrication processes, but current RTA technology can not be applied to silicon wafers larger than 300 mm in diameter. As a result, it is difficult to apply the RTA technique on very large substrates. Moreover, RTA has a maximum heating rate of 400° C./sec, and thus cannot be applied to a process requiring a higher heating rate.

Thus, research has been widely conducted on annealing techniques which can solve these problems and are free from processing limitations. Among them, a rapid annealing technique performed by applying an electrical field to a conductive layer and generating Joule heat can rapidly anneal a selected material by transfer of high heat, and has a much higher heating rate than the RTA technique. However, the above technique using Joule heat generated by the application of the electrical field cannot prevent physical detects due caused by arcs generated by the Joule heat.

SUMMARY OF THE INVENTION

Aspects of the present invention provide techniques of fabricating a thin film transistor that includes crystallizing a semiconductor layer by the application of an electrical field to metal layer, the metal layer later being patterned to become electrodes used in the device, and an organic light emitting diode (OLED) display device having the same. According to these techniques, a metal layer is in direct contact with a semiconductor layer, thereby preventing occurrence of arcing during the crystallization process, resulting in improved production yield due to a simpler process.

According to one aspect of the present invention, there is provided a thin film transistor that includes a substrate, a buffer layer arranged on the substrate, a semiconductor layer arranged on the buffer layer, source and drain electrodes arranged on the semiconductor layer and in direct contact with the semiconductor layer, a gate insulating layer arranged on an entire surface of the substrate, a gate electrode arranged on the gate insulating layer to correspond to the semiconductor layer and a protective layer arranged on the entire surface of the substrate, wherein the source and drain electrodes are electrically insulated from the gate electrode and the gate electrode does not overlap either of the source and drain electrodes Regions of the semiconductor layer that correspond to the source and drain electrodes can be doped with impurities. The source and drain electrodes can include a material such as molybdenum (Mo), chromium (Cr), tungsten (W), molybdenum-tungsten (MoW), aluminum (Al), aluminum-neodymium (Al—Nd), titanium (Ti), titanium nitride (TiN), copper (Cu), a Mo alloy, an Al alloy and a Cu alloy. The semiconductor layer can be a polycrystalline silicon layer produced by a Joule heating process.

According to another aspect of the present invention, there is provided a method of fabricating a thin film transistor that includes providing a substrate, forming a buffer layer on the substrate, forming an amorphous silicon layer pattern on the buffer layer, forming a metal layer on an entire surface of the substrate, forming a semiconductor layer by applying an electrical field to the metal layer to crystallize the amorphous silicon layer pattern, forming source and drain electrodes connected to the semiconductor layer by patterning the metal layer, forming a gate insulating layer on the entire surface of the substrate, forming a gate electrode on the gate insulating layer to correspond to the semiconductor layer and forming a protective layer on the entire surface of the substrate.

The method can also include doping portions of the amorphous silicon layer pattern with impurities after the forming the amorphous silicon layer pattern. The impurities can be N- or P-type impurities. The amorphous silicon layer pattern can include source and drain regions that correspond to the portions of the amorphous silicon layer pattern that are doped with the impurities. The doping the amorphous silicon layer pattern can be performed using a same mask as that used to pattern the metal layer to produce the source and drain electrodes. The metal layer can be formed to a thickness of 50 to 300 nm on the entire surface of the substrate. The electrical field applied to the metal layer to crystallize the amorphous silicon layer pattern can be in the range of 100 to 10000 V/cm. The source and drain electrodes and a metal pattern can include a material such as molybdenum (Mo), chromium (Cr), tungsten (W), molybdenum-tungsten (MoW), aluminum (Al), aluminum-neodymium (Al—Nd), titanium (Ti), titanium nitride (TiN), copper (Cu), a Mo alloy, an Al alloy and a Cu alloy.

According to yet another aspect of the present invention, there is provided a method of fabricating an organic light emitting diode (OLED) display device that includes providing a substrate, forming a buffer layer on an entire surface of the substrate, forming an amorphous silicon layer pattern on the buffer layer, forming a metal layer on the entire surface of the substrate, forming a semiconductor layer by applying an electrical field to the metal layer to crystallize the amorphous silicon layer pattern, forming source and drain electrodes connected to the semiconductor layer by patterning the metal layer, forming a gate insulating layer on the entire surface of the substrate, forming a gate electrode on the gate insulating layer at a location that corresponds to the semiconductor layer, forming a protective layer on the entire surface of the substrate, forming a planarization layer on the protective layer and forming a first electrode electrically connected to one of the source and drain electrodes, an organic layer and a second electrode on the planarization layer.

The method can also include doping portions of the amorphous silicon layer pattern with impurities after the forming the amorphous silicon layer pattern. The impurities can be N- or P-type impurities. The amorphous silicon layer pattern can include source and drain regions that correspond to the portions of the amorphous silicon layer pattern that are doped with the impurities. The doping the amorphous silicon layer pattern can be performed using a same mask as that used to pattern the metal layer to produce the source and drain electrodes. The metal layer can be formed to a thickness of 50 to 300 nm on the entire surface of the substrate. The electrical field applied to the metal layer to crystallize the amorphous silicon layer pattern can be in the range of 100 to 10000 V/cm. The source and drain electrodes and a metal pattern can include a material such as molybdenum (Mo), chromium (Cr), tungsten (W), molybdenum-tungsten (MoW), aluminum (Al), aluminum-neodymium (Al—Nd), titanium (Ti), titanium nitride (TiN), copper (Cu), a Mo alloy, an Al alloy and a Cu alloy.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1A:
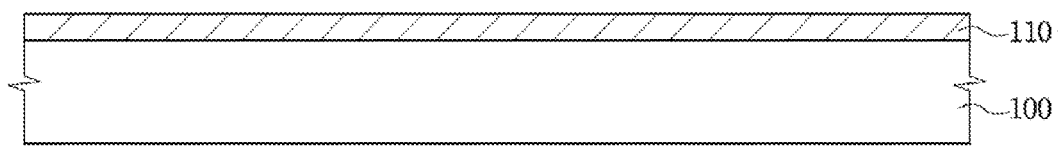
FIGS. 1A through 1F illustrate a method of fabricating a thin film transistor according to the present invention.

Reference will now be made in detail to the present embodiments of the present invention, examples of which are shown in the accompanying drawings, wherein like reference numerals refer to the like elements throughout. The embodiments are described below in order to explain the present invention by referring to the figures.

Exemplary Embodiment

FIGS. 1A through 1F illustrate a method of fabricating a thin film transistor according to an exemplary embodiment of the present invention.

Referring to FIG. 1A, a substrate 100 is prepared, and a buffer layer 110 is formed on the substrate 100. The substrate 100 can be made out of glass or plastic, and the buffer layer 110 serves to prevent out-diffusion of moisture or impurities from the substrate 100, or to facilitate the crystallization of an amorphous silicon layer by controlling a heat transfer rate during crystallization. The buffer layer 110 can be made out of an insulating layer such as a silicon oxide layer or a silicon nitride layer, or a combination thereof.

Figure 1B:
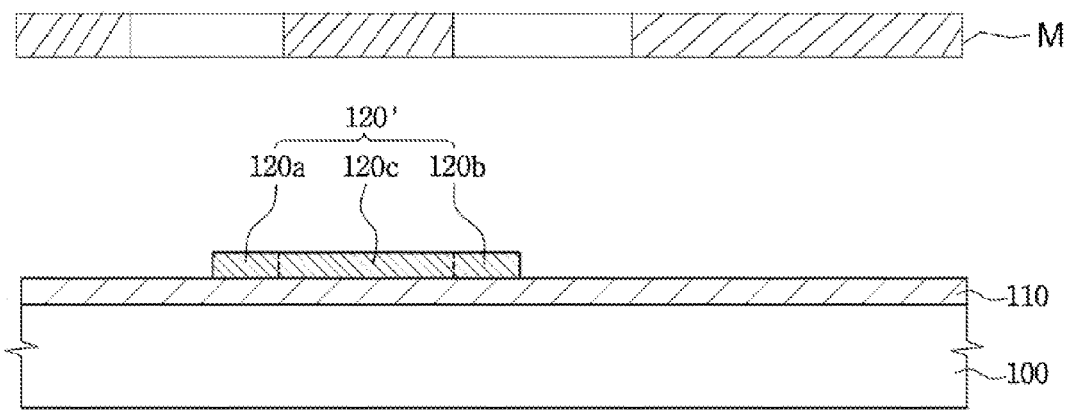

Afterwards, referring to FIG. 1B, an amorphous silicon layer pattern 120' is formed on the buffer layer 110. Subsequently, source and drain regions 120a and 120b of the amorphous silicon layer pattern are doped with impurities by using mask M. Here, the impurities can be N- or P-type. A region 120c, which is not doped with impurities, will be used as a channel region.

Figure 1C:
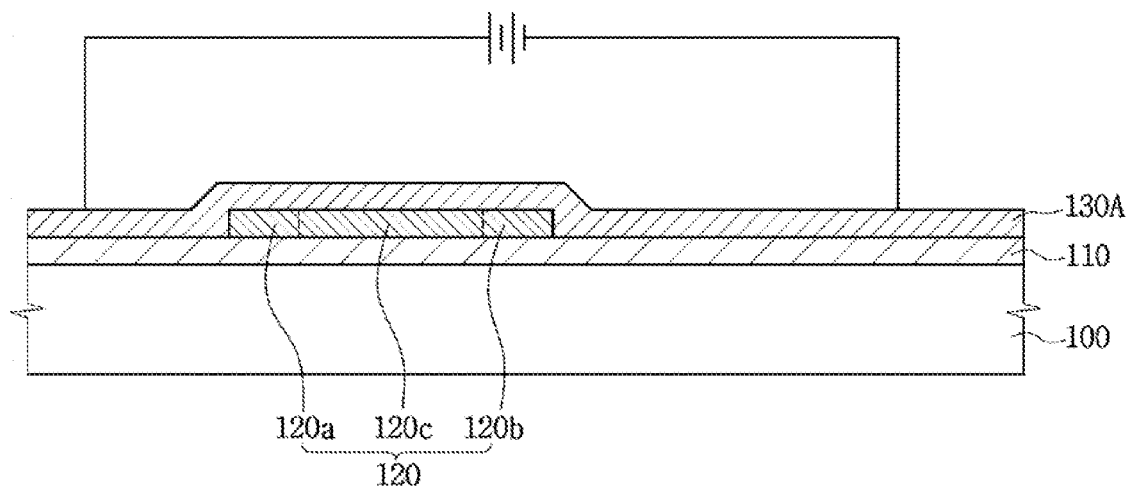
Figure 1D:
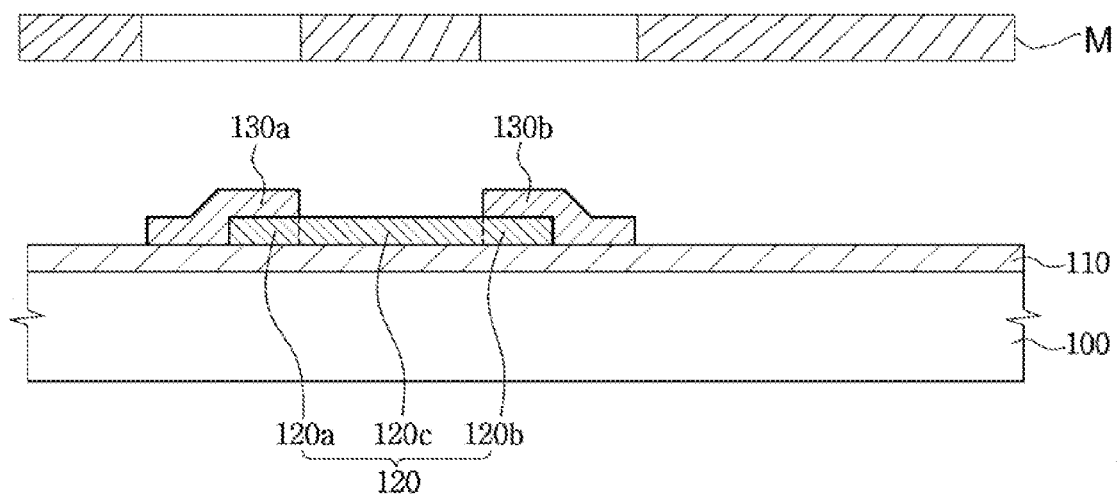

Subsequently, referring to FIG. 1C, a metal layer 130A is formed on the entire surface of the substrate 100. An electrical field is then applied to the metal layer 130A to crystallize the amorphous silicon layer 120' into a semiconductor layer 120.

The metal layer 130A can be made out of one of molybdenum (Mo), chromium (Cr), tungsten (W), molybdenum-tungsten (MoW), aluminum (Al), aluminum-neodymium (Al—Nd), titanium (Ti), titanium nitride (TiN), copper (Cu), a Mo alloy, an Al alloy or a Cu alloy.

The metal layer 130A is generally formed to a thickness suitable for forming source and drain electrodes 130a and 130b, which is preferably in the range of 50 to 300 nm. When the thickness of the metal layer 130A is less than 50 nm, the metal layer 130A for source and drain electrodes is not uniformly formed, and thus non-uniformity of crystallization occurs due to non-uniform heat transfer. Moreover, the metal layer having a thickness of 300 nm or less favorably serves as source and drain electrodes upon patterning, so that this range of thickness is suitable for a thin film device.

Here, for favorable crystallization, an electric field of 100 to 10000 V/cm is applied for 1 μs to 1 s. An electrical field of less than 100 V/cm cannot generate sufficient Joule heat for crystallization, and an electrical field of more than 10000 V/cm can generate a local arc. Further, when an electrical field is applied for less than 1 μs, crystallization may not be facilitated due to insufficient Joule heat, and when an electrical field is applied for more than 1 s, the substrate can bend or have defects at the edges due to heat transfer from crystallization, which can have a negative influence on the device.

Afterwards, the metal layer 130A is patterned to produce the source and drain electrodes 130a and 130b. Here, the source and drain electrodes 130a and 130b are patterned to correspond to the source and drain regions 120a and 120b of the semiconductor layer 120. In doing so, a same mask M that is used to dope the amorphous silicon layer may also be used to pattern the metal layer into the source and drain electrodes.

Figure 1E:
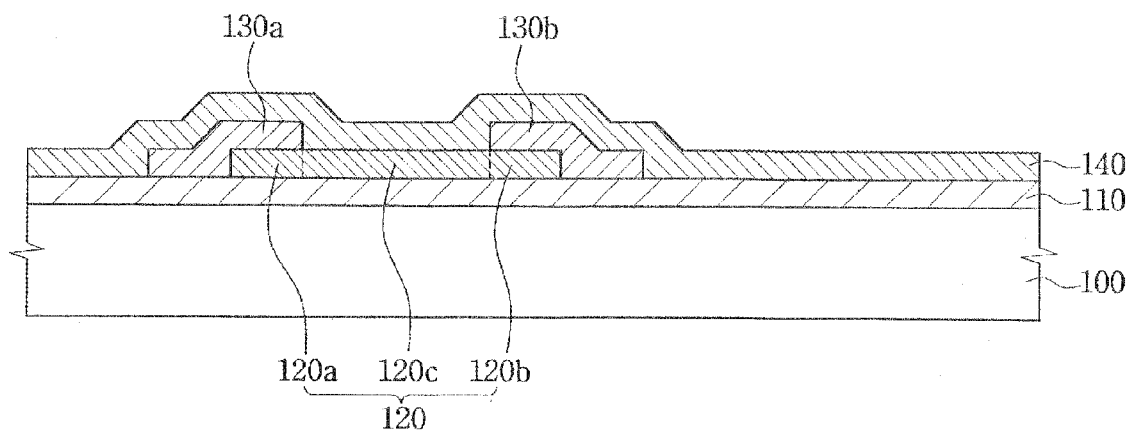

Then, referring to FIG. 1E, a gate insulating layer 140 is formed on the entire surface of the substrate 100. The gate insulating layer 140 can be a silicon oxide layer, a silicon nitride layer, or a combination thereof.

Figure 1F:
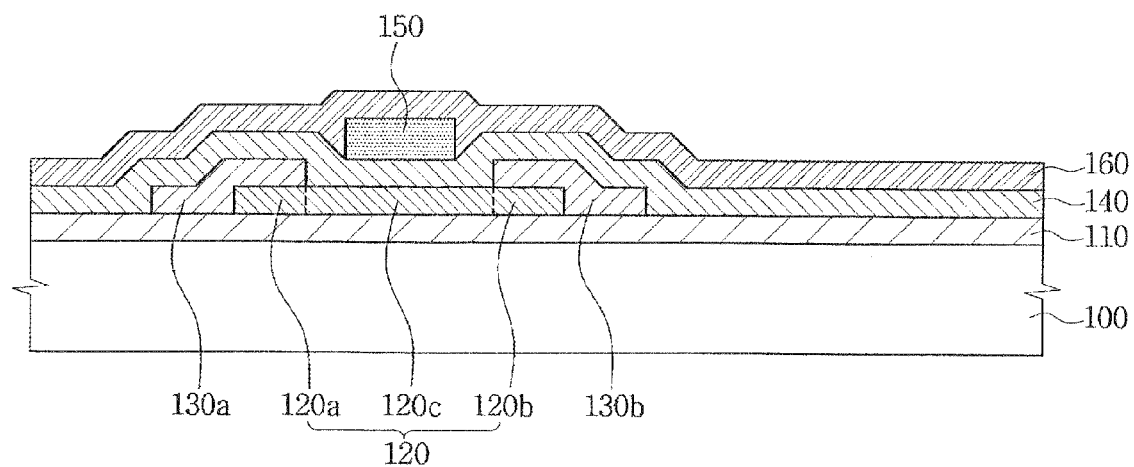

Referring to FIG. 1F, a gate electrode 150 is formed on the gate insulating layer 140 at a location that corresponds to the semiconductor layer 120. The gate electrode 150 can be formed over the channel region 120c of the semiconductor layer 120 so as not to overlap either of the source and drain electrodes 130a and 130b. The gate electrode 150 can be formed as a single layer structure made out of aluminum or an aluminum alloy such as an Al—Nd alloy. Alternatively, the gate electrode 150 can be a multi-layer structure in which an Al alloy layer is stacked on a Cr or Mo alloy layer.

Subsequently, a protective layer 160 is formed on the entire surface of the substrate 100, and thus a thin film transistor according to the present invention is completed.

Figure 2A:
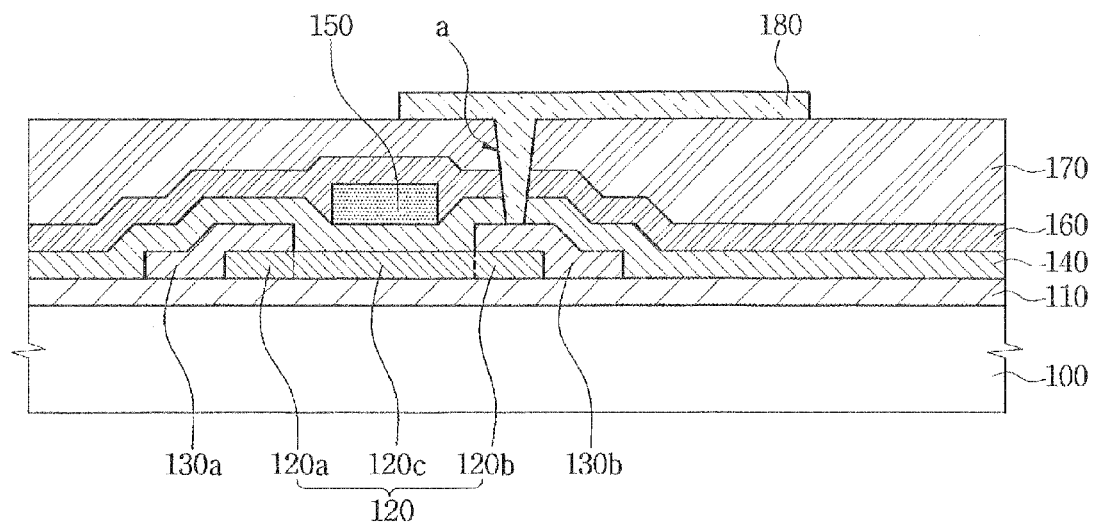
FIGS. 2A and 2B illustrate a method of fabricating an OLED display device according to the present invention.
Figure 2B:
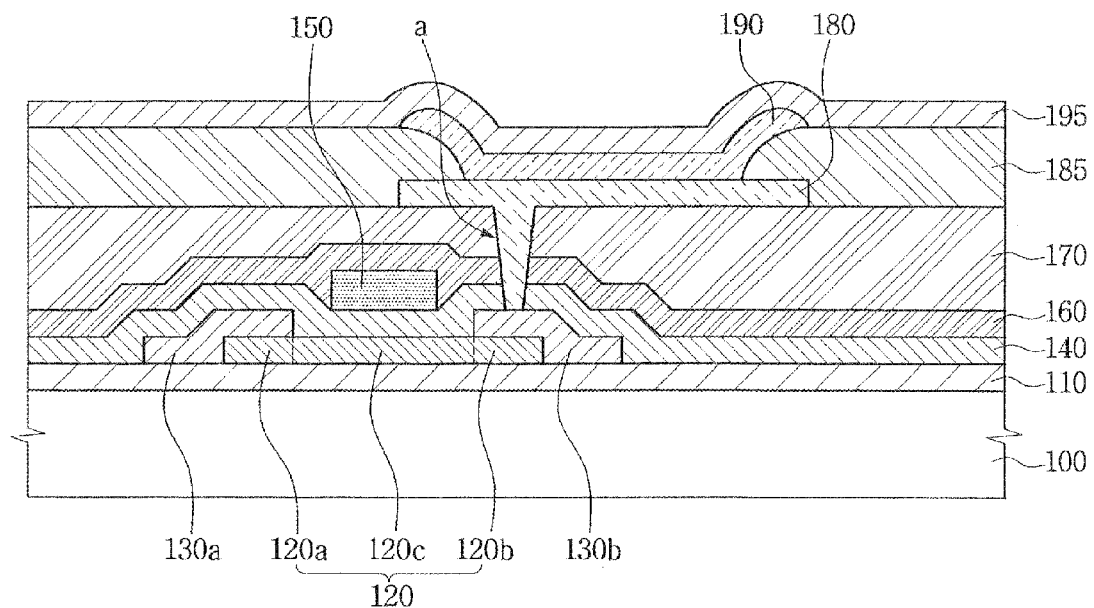

FIGS. 2A and 2B are cross-sectional views of an OLED display device having the thin film transistor according to an exemplary embodiment of the present invention. Here, the OLED display device to be described as having the thin film transistor of FIG. 1F.

Referring to FIG. 2A, a planarization layer 170 is formed on the entire surface of the substrate 100 having the thin film transistor according to the exemplary embodiment of the present invention described with reference to FIGS. 1A through 1F. The planarization layer 170 can be made out of a material such as silicon oxide, silicon nitride, and silicate on glass, an organic layer made out of polyimide, benzocyclobutene-based resin, or acrylate. Alternatively, the planarization layer 170 can instead be a stacked structure of the inorganic layer and the organic layer.

The gate insulating layer 140, the protective layer 160 and the planarization layer 170 are etched, thereby forming a via hole a and thus partially exposing one of the source and drain electrodes 130a and 130b.

Afterwards, a first electrode 180 connected to the exposed one of the source and drain electrodes 130a and 130b through the via hole a is formed. The first electrode 180 can be an anode or a cathode. When the first electrode 180 is an anode, the anode can be made out of a transparent conductive material such as indium tin oxide (ITO), indium zinc oxide (IZO) or indium tin zinc oxide (ITZO), and when the first electrode 180 is a cathode, the cathode can be made out of Mg, Ca, Al, Ag, Ba or an alloy thereof.

Subsequently, referring to FIG. 2B, a pixel defining layer 185 having an opening partially exposing a surface of the first electrode 180 is formed on the first electrode 180, and an organic layer 190 having an emission layer is formed on the exposed first electrode 180. The organic layer 190 can further include one or more of a hole injection layer, a hole transport layer, a hole blocking layer, an electron blocking layer, an electron injection layer, and an electron transport layer. Then, a second electrode 195 is formed on the organic layer 190. Thus, an OLED display device according to the exemplary embodiment of the present invention is completed.

To form an electrode, when an amorphous silicon layer is crystallized into a polycrystalline silicon layer by applying an electrical field to a thin metal film, occurrence of an arc caused by Joule heat during the process of forming the polycrystalline silicon layer can be prevented. Since the metal layer is directly formed on an amorphous silicon layer pattern, the crystallization can be effectively performed, and the metal layer is then patterned to form source and drain electrodes, thereby increasing the production yield with a simple fabrication process.

Although the present invention has been described with reference to predetermined exemplary embodiments thereof, it will be understood by those skilled in the art that a variety of modifications and variations may be made to the present invention without departing from the spirit or scope of the present invention defined in the appended claims and their equivalents.

What is claimed is:

1. A method of fabricating a thin film transistor, comprising:
providing a substrate;
forming a buffer layer on the substrate;
forming an amorphous silicon layer pattern on the buffer layer;
doping portions of the amorphous silicon layer pattern with impurities after said forming of the amorphous silicon layer pattern;
forming a metal layer on an entire surface of the substrate;
forming a semiconductor layer by applying an electrical field to the metal layer to crystallize the amorphous silicon layer pattern;
forming source and drain electrodes connected to the semiconductor layer by patterning the metal layer;
forming a gate insulating layer on the entire surface of the substrate;
forming a gate electrode on the gate insulating layer to correspond to the semiconductor layer; and
forming a protective layer on the entire surface of the substrate.

2. The method according to claim 1, wherein the impurities are N- or P-type impurities.

3. The method according to claim 1, wherein the amorphous silicon layer pattern includes source and drain regions that correspond to the portions of the amorphous silicon layer pattern that are doped with the impurities.

4. The method according to claim 1, wherein the doping of the amorphous silicon layer pattern is performed using a same mask as that used to pattern the metal layer to produce the source and drain electrodes.

5. The method according to claim 1, wherein the metal layer is formed to a thickness of 50 to 300 nm on the entire surface of the substrate.

6. The method according to claim 1, wherein the electrical field applied to the metal layer to crystallize the amorphous silicon layer pattern is in the range of 100 to 10000 V/cm.

7. The method according to claim 1, wherein the source and drain electrodes and a metal pattern are comprised of a material selected from a group consisting of molybdenum (Mo), chromium (Cr), tungsten (W), molybdenum-tungsten (MoW), aluminum (Al), aluminum-neodymium (Al—Nd), titanium (Ti), titanium nitride (TiN), copper (Cu), a Mo alloy, an Al alloy and a Cu alloy.

8. The method according to claim 1, further comprising patterning the amorphous silicon layer prior to said crystallization.

9. The method according to claim 1, wherein a portion of the metal layer is arranged directly on an entire upper surface of the amorphous silicon layer pattern, and wherein the amorphous silicon layer pattern arranged directly underneath the metal layer is crystallized into polysilicon upon said application of the electric field to the metal layer.

10. The method of claim 1, wherein the doping occurs prior to the crystallizing of the amorphous silicon layer pattern.

11. A method of fabricating an organic light emitting diode (OLED) display device, comprising:
providing a substrate;
forming a buffer layer on an entire surface of the substrate;
forming an amorphous silicon layer pattern on the buffer layer;
doping portions of the amorphous silicon layer pattern with impurities after said forming of the amorphous silicon layer pattern;
forming a metal layer on the entire surface of the substrate;
forming a semiconductor layer by applying an electrical field to the metal layer to crystallize the amorphous silicon layer pattern;
forming source and drain electrodes connected to the semiconductor layer by patterning the metal layer;
forming a gate insulating layer on the entire surface of the substrate;
forming a gate electrode on the gate insulating layer at a location that corresponds to the semiconductor layer;
forming a protective layer on the entire surface of the substrate;
forming a planarization layer on the protective layer; and
forming a first electrode electrically connected to one of the source and drain electrodes, an organic layer and a second electrode on the planarization layer.

12. The method according to claim 11, wherein the impurities are N- or P-type impurities.

13. The method according to claim 11, wherein the amorphous silicon layer pattern includes source and drain regions that correspond to the portions of the amorphous silicon layer pattern that are doped with the impurities.

14. The method according to claim 11, wherein the doping is performed using a same mask as that used to pattern the metal layer.

15. The method according to claim 11, wherein the metal layer is formed to a thickness of 50 to 300 nm.

16. The method according to claim 11, wherein the electrical field applied to the metal layer to crystallize the amorphous silicon layer pattern is in the range of 100 to 10000 V/cm.

17. The method according to claim 11, wherein the source and drain electrodes and the metal layer are comprised of a same material, are arranged on a same layer and are comprised of a material selected from a group consisting of molybdenum (Mo), chromium (Cr), tungsten (W), molybdenum-tungsten (MoW), aluminum (Al), aluminum-neodymium (Al—Nd), titanium (Ti), titanium nitride (TiN), copper (Cu), a Mo alloy, an Al alloy and a Cu alloy.

18. The method according to claim 11, further comprising patterning the amorphous silicon layer prior to said crystallization.

19. The method according to claim 11, wherein a portion of the metal layer is arranged directly on an entire upper surface of the amorphous silicon layer pattern, and wherein the amorphous silicon layer pattern arranged directly underneath the metal layer is crystallized into polysilicon upon said application of the electric field to the metal layer.

20. The method of claim 11, wherein the doping occurs prior to the crystallizing of the amorphous silicon layer pattern.

* * * * *